(12) United States Patent
Hsu et al.

(10) Patent No.: US 7,608,884 B2
(45) Date of Patent: Oct. 27, 2009

(54) SCALABLE SPLIT-GATE FLASH MEMORY CELL WITH HIGH SOURCE-COUPLING RATIO

(75) Inventors: Te-Hsun Hsu, Hsinchu (TW); Hung-Cheng Sung, Hsinchu (TW)

(73) Assignee: Taiwan Semiconductor Manufactruing Co., Ltd., Hsin-Chu (TW)

( * ) Notice: Subject to any disclaimer, the term of this patent is extended or adjusted under 35 U.S.C. 154(b) by 394 days.

(21) Appl. No.: 11/088,492

(22) Filed: Mar. 24, 2005

(65) Prior Publication Data
US 2006/0214214 A1 Sep. 28, 2006

(51) Int. Cl.
*H01L 29/788* (2006.01)

(52) U.S. Cl. ............... 257/316; 257/E21.681; 438/267

(58) Field of Classification Search ................. 257/314, 257/316, E21.681
See application file for complete search history.

(56) References Cited

U.S. PATENT DOCUMENTS

| | | | | |
|---|---|---|---|---|
| 5,949,706 | A * | 9/1999 | Chang et al. | 365/156 |
| 6,355,527 | B1 | 3/2002 | Lin et al. | 438/265 |
| 6,380,583 | B1 | 4/2002 | Hsieh et al. | 257/314 |
| 6,388,293 | B1 * | 5/2002 | Ogura et al. | 257/365 |
| 6,593,177 | B2 * | 7/2003 | Lee | 438/201 |
| 2002/0109181 | A1 | 8/2002 | Hsieh et al. | 257/314 |
| 2002/0142545 | A1 | 10/2002 | Lin | 438/257 |
| 2003/0068859 | A1 * | 4/2003 | Leung et al. | 438/257 |
| 2006/0006455 | A1 * | 1/2006 | Chen et al. | 257/314 |
| 2006/0163645 | A1 * | 7/2006 | Guterman et al. | 257/316 |

FOREIGN PATENT DOCUMENTS

TW 200418143 3/1992

* cited by examiner

*Primary Examiner*—Jerome Jackson, Jr.
*Assistant Examiner*—Paul A Budd
(74) *Attorney, Agent, or Firm*—K&L Gates LLP

(57) ABSTRACT

A system and method provides an improved source-coupling ratio in flash memories. In one embodiment, a flash memory cell system with high source-coupling ratio includes at least a conventional floating gate device having a floating gate, a drain and a source. The floating gate is formed over a first junction for charging the floating gate by electron injection from the source to the floating gate and at least a first dielectric is layered on top of the floating gate to form a second junction. At least a first polycrystalline silicon is layered on top of the first dielectric, the first polycrystalline silicon electrically connected to the source. Electron tunneling provided through the second junction to the floating gate charges the floating gate, thereby increasing the source-coupling ratio of the floating gate and increasing the efficiency of storing electrical charge.

19 Claims, 7 Drawing Sheets

804

806

808

US 7,608,884 B2

SCALABLE SPLIT-GATE FLASH MEMORY CELL WITH HIGH SOURCE-COUPLING RATIO

BACKGROUND

The present invention relates generally to integrated circuits, and more particularly to a system to improve source-coupling ratio of integrated memory circuits.

An electrically erasable programmable read only memory (EEPROM) is not the fastest memory, but the data it holds is stable over a very long time. An EEPROM, or a flash EEPROM, is programmed as the charge on an isolated or floating gate is changed. The charge on the floating gate is derived from the MOS channel under certain voltage conditions. The required voltages strongly reverse bias either the source or the drain junction. Under such conditions, channel current arriving at that junction is greatly composed of high energy or "hot" current carriers, preferably electrons. Some of the hot electrons traversing a junction near a substrate surface are injected into an overlying oxide, and further to a neighboring structure, such as a floating, or isolated, poly gate. The efficiency of the charging of the floating gate by hot electron injection determines source-coupling ratio. The charge collected in that gate causes the gate to act just as if it had received a signal from any other source. So, the MOS transistor can be induced to switch itself and remain stable in the new state. By programming the MOS transistor to be in one state or the other, a memory function can be created.

A flash EEPROM cell is typically constructed in either of two arrangements. In a split gate arrangement, both the floating gate and the word line, or control gate, reside directly above the MOS channel and control channel current serially. In a stack gate arrangement, the floating gate resides directly above the MOS channel, and the control gate resides directly above the floating gate. The stack gate arrangement occupies slightly less lateral space. The split gate arrangement has a strong advantage of serial control, wherein the control gate can shut off current flow in the channel completely and independently of the floating gate charge condition.

The junction edge, with this function, is diffused well underneath the floating gate to maximize the overlap area for charge collection. However, as technology generations shrink semiconductor device geometries, the channel length becomes shorter, thereby increasing the likelihood of MOS punch through. As such, the MOS channel length must be rescaled without the imposition of the source junction, typically by retreating the source junction edge. However, by retreating the source junction edge from under the floating gate back towards the edge of the floating gate, source-coupling ratio may be reduced. When the source-coupling ratio is reduced, the ability to program the MOS transistor as though it is a memory device becomes more difficult and slower.

Therefore, desirable in the art of are additional designs that provide an improved source-coupling ratio in integrated circuit memories.

SUMMARY

In view of the foregoing, the following provides a system and method to provide an improved source-coupling ratio in flash memory cells.

In one embodiment, a flash memory cell system with high source-coupling ratio comprises at least a conventional floating gate device having a floating gate, a drain and a source, with the floating gate further formed over a first junction for charging the floating gate by electron injection from the source to the floating gate; and at least a first dielectric to be layered on top of the floating gate for forming a second junction. At least a first polycrystalline silicon is to be layered on top of the first dielectric, with the first polycrystalline silicon electrically connected to the source, wherein electron tunneling provided through the second junction to the floating gate charges the floating gate, thereby increasing the source-coupling ratio of the floating gate and thereby increasing the efficiency of storing electrical charge.

The construction and method of operation of the invention, however, together with additional objects and advantages thereof will be best understood from the following description of specific embodiments when read in connection with the accompanying drawings.

DESCRIPTION

The following will provide a detailed description of a system and method to provide an improved source-coupling ratio in integrated memory circuits.

An electrically erasable programmable read only memory (EEPROM) or flash EEPROM can be constructed in memories with the recent small device geometries, and yet with a high source-coupling ratio. At least part of the programming function, and also the erasing function, can be shifted from hot electron injection to electron tunneling. The source junction becomes shallower such that the junction advances less far under the floating gate poly, thereby leaving the channel length available to normal MOS function without punch through. The feature embodying samples are described with the following figures.

Figure 1:
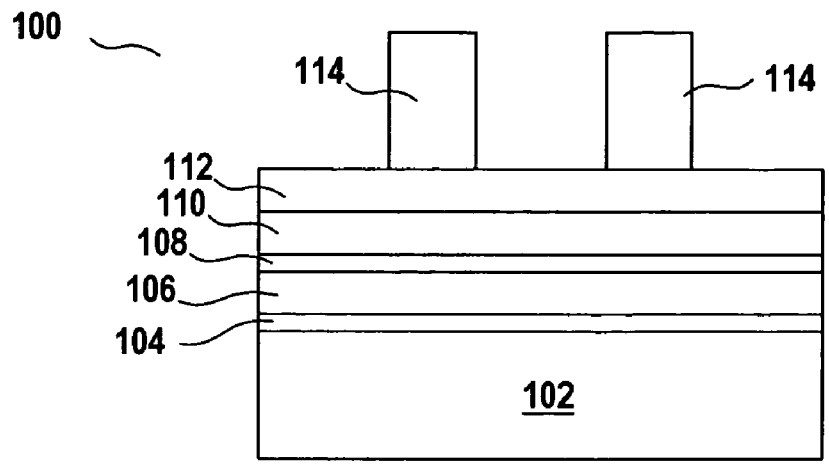
FIGS. 1-5 present a set of cross sections explaining the processing steps in building an EEPROM cell in accordance with one embodiment of the present invention.

FIGS. 1-5 present a set of cross sections explaining the processing steps in building an EEPROM system in accordance with one embodiment of the present invention. In FIG. 1, a cross section 100 illustrates an early stage in the construction of a scalable split-gate memory cell with a high source-coupling ratio in accordance with one embodiment of the present invention. On a semiconductor substrate 102, a sacrificial oxide is grown and then etched away. A multiply self-aligned process allows the following formation of several material layers with the intervention of few other steps. A floating gate oxide 104 is grown on the substrate 102. Instead of grown thermal oxide, the floating gate oxide 104 could be oxide-nitride-oxide, a nano-crystalline material, or a similar suitable film. A floating gate polycrystalline silicon (poly or polysilicon) layer 106 is deposited on the floating gate oxide 104.

A standard shallow trench isolation (STI) process sequence, not shown, is then completed here. A source gate oxide 108 layer is deposited on the floating gate poly 106. A source gate poly 110 layer is deposited on the source gate oxide 108. A tetraethylorthosilane (TEOS) or other deposited oxide 112 layer is then deposited on the source gate poly 110. A photoresist layer to define various floating gate patterns 114 is formed, exposed, developed, and baked.

Figure 2:
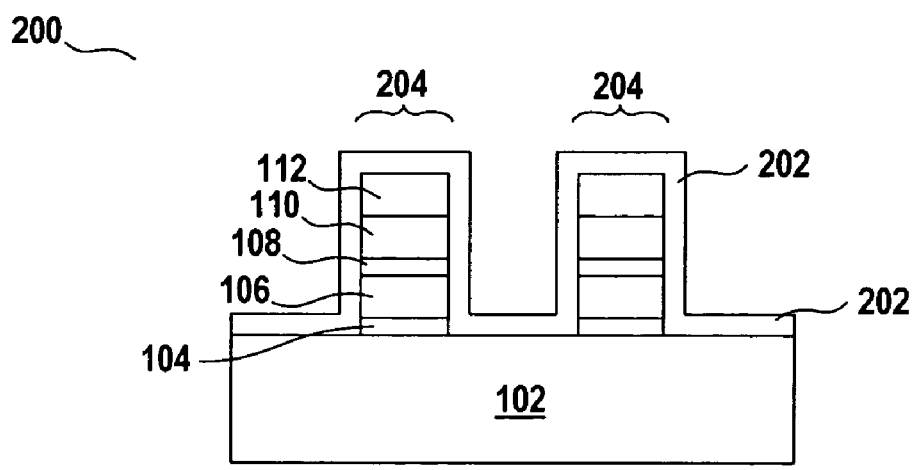

In FIG. 2, a cross section 200 illustrates the definition of first structures in accordance with one embodiment of the present invention. Using the various photoresist patterns 114 of FIG. 1, the portion not covered by the photoresist patterns 114 of FIG. 1 is etched down to the substrate 102, including a portion of the TEOS oxide 112, a portion of the source gate poly 110, a portion of the source gate oxide 108, a portion of the floating gate poly 106, and a portion of the floating gate oxide 104. The photoresist patterns 114 are removed. Discrete stacks 204 are produced and include upper oxide 112, source gate poly 110, source gate oxide 108, floating gate poly 106 and floating gate oxide 104. A high temperature oxide 202 layer is then deposited on top and sides of various layer stacks 204 and on the substrate 102.

Figure 3:
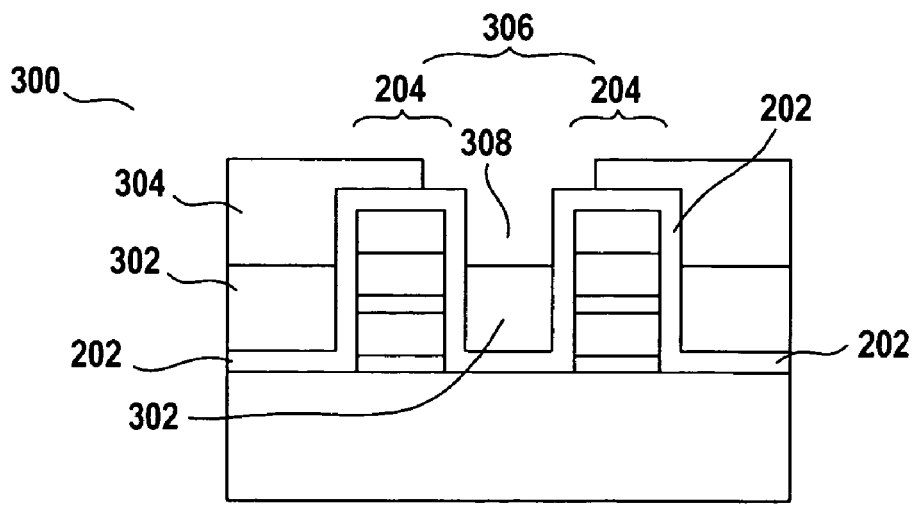

In FIG. 3, a cross section 300 illustrates the further definition of structures, in accordance with one embodiment of the present invention. An optional layer is deposited as a bottom antireflective coating (BARC) 302. The BARC 302 is then etched back to provide a coating on the high temperature oxide 202 that lies between devices and within the space between the layer stacks 204. The BARC 302 improves the image definition that is printed in the succeeding photoresist. A high voltage implant photoresist layer 304, which is used to define a cell window pattern 306 above the inner portions of the layer stacks 204 and a space 308 between them, is deposited, exposed, developed, and baked.

Figure 4:
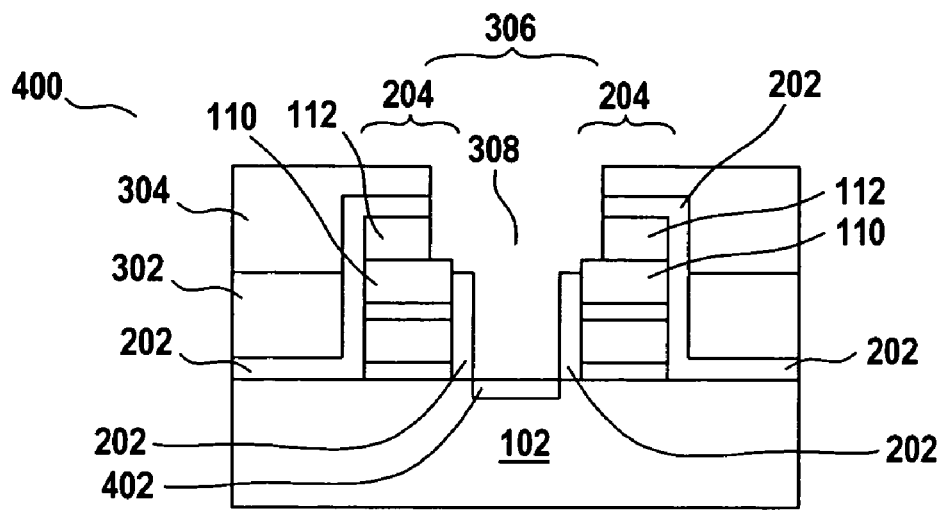

In FIG. 4, a cross section 400 illustrates yet a further definition of structures, in accordance with one embodiment of the present invention. The photoresist layer 304 is used to allow the etching of portions of the high temperature oxide 202, the TEOS oxide 112, and the BARC 302. It is understood that a portion of the BARC 302 is shown between the layer stacks 204 in FIG. 3. This etch through the cell window pattern 306 exposes portions of the source gate poly 110 that are in the layer stacks 204 and also exposes the small portion of the substrate 102 that is at the bottom of the space 308 between the layer stacks 204. A source implant dopes the exposed portions of the source gate poly 110 and also creates a metal-oxide-semiconductor (MOS) source 402, which is implanted in the substrate 102 at the bottom of the space 308. Photoresist layer 304 and the BARC 302 are then each removed by a specifically acting etch.

Figure 5:
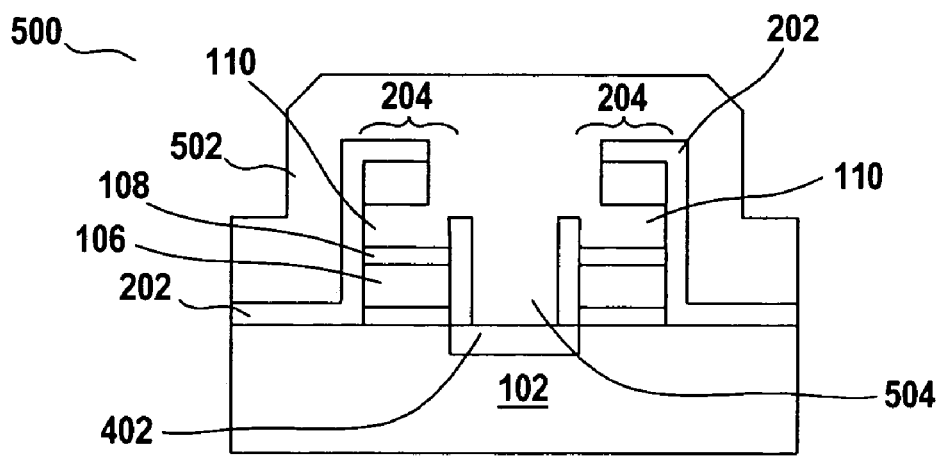

In FIG. 5, a cross section 500 illustrates yet a further definition of structures, in accordance with one embodiment of the present invention. A semiconductor material such as cell poly 502 is deposited. By nature, since poly deposition is conformal, it is understood that the cell poly 502 covers the high temperature oxide 202 that covers the substrate 102 between devices, and covers and surrounds the layer stacks 204. The space 308, shown earlier in FIG. 4, is now filled and becomes a source poly plug 504, which contacts the MOS source 402 in the substrate 102, and contacts the source gate poly 110 on one side of layer stack 204. Again, the source gate poly 110 overlies the floating gate poly 106, and is separated from it by the source gate oxide 108. The MOS source 402, which is implanted, is diffused to become deeper and wide enough to reach the edge of the floating gate poly 106. In one embodiment, the intersection between the MOS source 402 and the channel formed between MOS source 402 and MOS drain 610, is disposed beneath an edge of floating gate poly 106.

Figure 6:
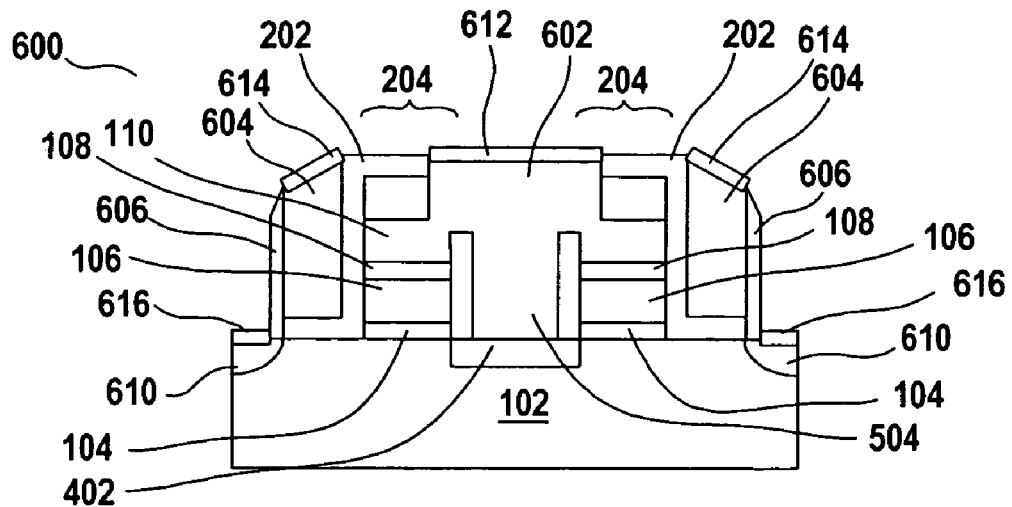
FIG. 6 presents a cross section of an EEPROM cell with a high source-coupling ratio in accordance with one embodiment of the present invention.

In FIG. 6, a cross section 600 illustrates yet a further definition of structures, in accordance with one embodiment of the present invention. This is a finished front end structure of a split-gate memory cell before metal processing. Anisotropic dry etching is used to remove portions of the cell poly 502, shown previously in FIG. 5. This leaves a source line poly 602 under a previous horizontal area of the cell poly 502. This also leaves poly sidewall spacers, under the previous vertical area of the cell poly 502. These poly sidewall spacers, being connected to word lines, can be seen as control gates 604 and are insulated from the floating gate poly 106 by a vertical portion of high temperature oxide 202. The high temperature oxide 202 at the top of the layer stacks 204 is now exposed.

Oxide sidewall spacers 606 are created by first depositing a layer of oxide, and then using anisotropic dry etching to remove most of the oxide deposited on horizontal surfaces, including surfaces such as the surface of the source line poly 602, the surface of the control gates 604, and the surfaces of the substrate 102.

All the exposed poly areas are open to a source/drain implant. The implant is diffused to form MOS drains 610 in the substrate 102. It can be seen that the combination of the floating gate poly 106, the floating gate oxide 104, the MOS drain 610 and the MOS source 402 can be seen as a conventional floating gate device. Metal is then deposited and alloyed into the exposed poly surfaces to form poly self-aligned silicide, or salicide. Excess metal is removed from the surfaces of the high temperature oxide 202, and from the surfaces of the oxide sidewall spacer 606 using conventional methods. Salicide, for good electrical contact and current spreading, is now established on a salicided surface 612 on the source line poly 602, on salicided surfaces 614 on the control gates 604, and on salicided surfaces 616 of the MOS drains 610.

An EEPROM is programmed as the charge on the floating gate poly 106 is changed. Traditionally, the charge is derived from hot electron injection from the MOS source 402 junction when it is strongly reverse biased. The MOS source junction is typically diffused laterally underneath the floating gate poly. This occupies a portion of the length of the MOS channel. With smaller device geometries and, therefore, shorter designed channel lengths, there is a greater hazard of punch through. The junction that injects hot electrons into the floating gate oxide should desirably be retreated to a location nearer to the edge of the floating gate in order to allow use of most of the channel length beneath the floating gate. A shortcoming of locating the junction near the edge of the floating gate is that programming becomes weaker and slower since there is less floating gate area overlying the junction to collect injected charged carriers. The source-coupling ratio is reduced and programming becomes more difficult and slower.

The present invention shifts at least part of the programming function to gate-to-gate tunneling. The tunneling occurs between the source gate poly 110 and the floating gate poly 106. The tunneling occurs through the source gate oxide 108, to be seen as another junction. Typical programming voltages are applied to the source line poly 602, which is connected to the MOS source 402, applied to the control gate 604, and applied to the MOS drains 610. It is understood by those skilled in the art that the application of typical erase voltages also causes tunneling.

When, for programming, the source is forced to a high voltage using conventional biasing methods, the junction of the MOS source 402 is strongly reverse biased relative to the substrate 102, while the source gate poly 110, which is now electrically connected to the source line poly 602, the source poly plug 504 and the MOS source 402, is strongly reverse biased relative to the floating gate poly 106. The junction of the MOS source 402 injects hot electrons into and through the floating gate oxide 104 to the floating gate poly 106. This action helps to charge the floating gate or program the memory cell to a memory state. However, since the junction has been moved back nearer to the edge of the floating gate, the efficiency of this programming mechanism is reduced. The difference, and also an increase, in charging efficiency, is supplied by electron tunneling. The thickness of the source gate oxide 108 and composition are specified so as to promote electron tunneling between the source gate poly 110 and the floating gate poly 106 at programming or erasing voltage. Interposing the self-aligned source poly plug 504 and increasing the overlapping area of the two poly layers increase the capacitance and the total tunneling, and therefore, the efficiency and speed of programming, and the source-coupling ratio. Conventional connection and biasing means are used to bias the structure as indicated.

Figure 7:
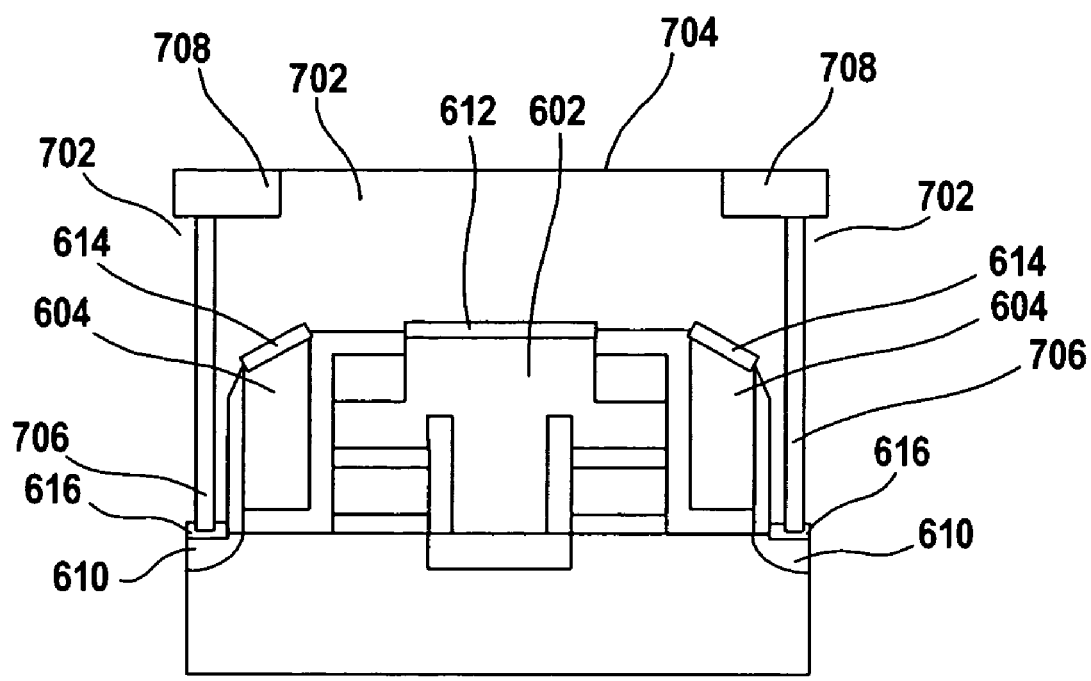
FIG. 7 presents a cross section of an EEPROM cell with a high source-coupling ratio further connected to a first metal layer in accordance with one embodiment of the present invention.
Figure 8A:
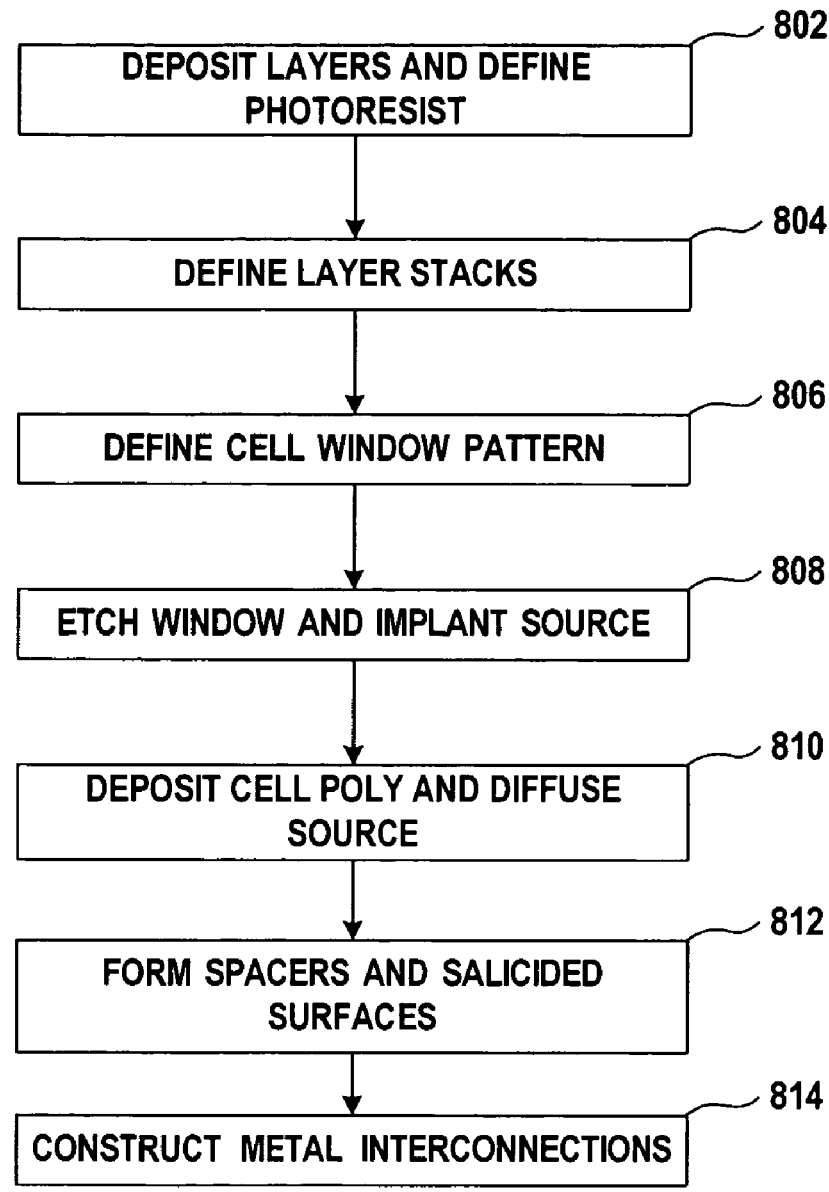
FIG. 8A presents a process flow in accordance with one embodiment of the present invention.
Figure 8B:
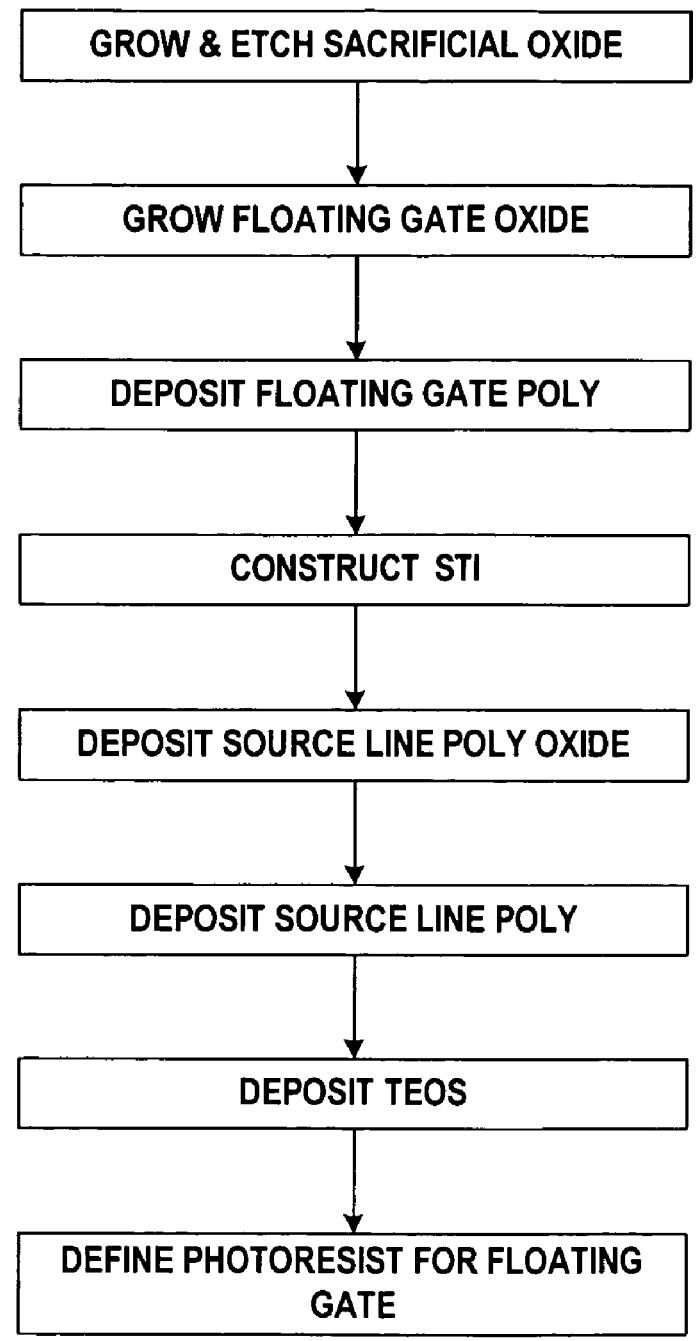
FIGS. 8B-8G present various detailed process flows in accordance with one embodiment of the present invention.
Figure 8C:
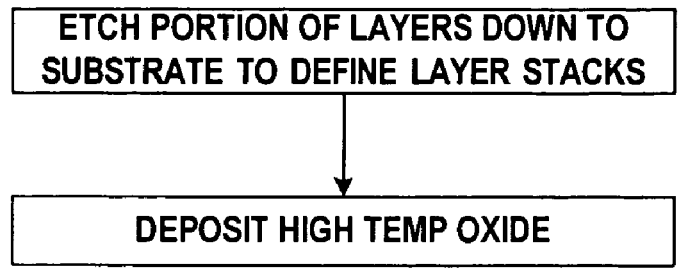
Figure 8D:
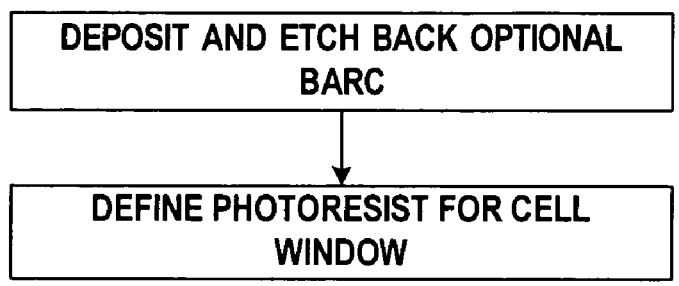
Figure 8E:
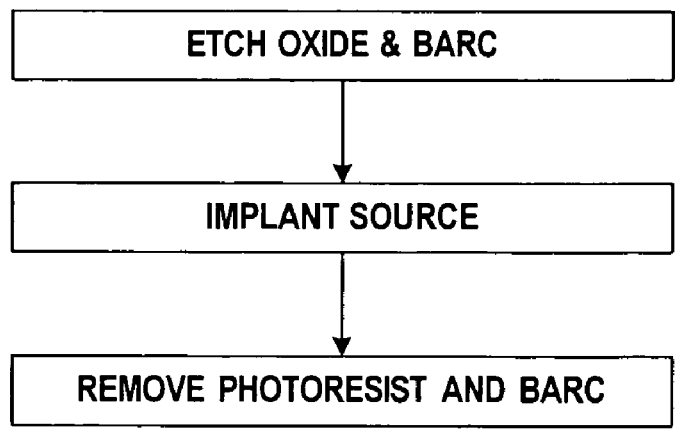
Figure 8F:
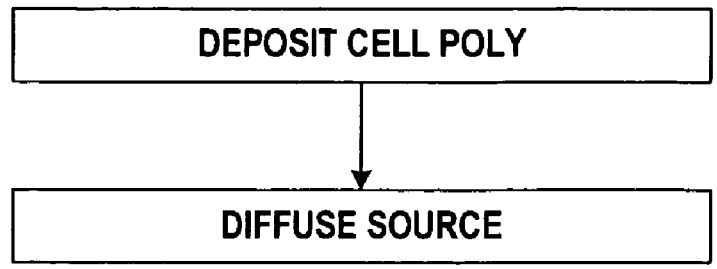
Figure 8G:
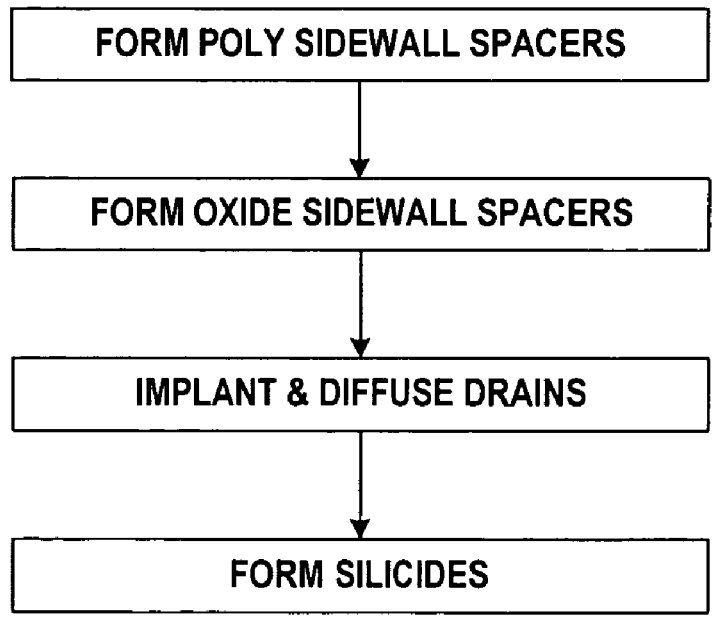

In FIG. 7, a cross section 700 illustrates yet a further definition of structures, in accordance with one embodiment of the present invention. The front end structure shown in the cross section 600 in FIG. 6 now enters a backend processing for interconnection metallization. An interlevel dielectric 702 is deposited. This is then planarized, typically by chemical-mechanical-polishing (CMP), to create a flat surface 704. Photolithography and etching construct various vertical vias 706 that connect to the salicided surface 616 on the MOS drains 610. Connections to the salicided surface 612 on the source line poly 602 and to the salicided surfaces 614 of the control gates 604 are made outside the plane of this cross section. Photolithography and etching construct horizontal trenches 708 that connect to the vias 706. The vias 706 and trenches 708 are filled with metal, typically copper. The whole structure is now ready for succeeding levels of dielectric and metal.

FIG. 8 presents a process flow 800 in accordance with one embodiment of the present invention. In step 802, various oxide and poly layers are deposited on a semiconductor substrate, and then the photoresist is defined. FIG. 8B provides a more detailed explanation of the step 802. In step 804, layer stacks are defined by etching a portion of the various oxide and poly layers to the semiconductor substrate. In addition, a high temperature oxide is deposited thereon. FIG. 8C provides a more detailed explanation of the step 804. In step 806, a cell window pattern is defined. In step 808, a plurality of oxide and BARC layers deposited when the cell window pattern is defined is etched away. Then the MOS source is implanted. Before step 810, photoresist and BARC layers are removed. FIG. 8D provides a more detailed explanation of the step 806. In step 810, after a cell poly is deposited, the implanted MOS source is diffused. FIG. 8E provides a more detailed explanation of the step 808. In step 812, poly and oxide sidewall spacers are further formed. Then, drains and implanted and diffused, before silicides are formed thereon, as well as on various polys. FIG. 8F provides a more detailed explanation of the step 810. Finally, in step 814, metal interconnections to one or more metal layers are formed. FIG. 8G provides a more detailed explanation of the step 812.

In newer, smaller MOS devices, the MOS source junction edge that injects hot electrons into and through the overlying oxide to the floating gate should be returned to a location nearer to the edge of the floating gate. Programming now becomes weaker and slower since there is less floating gate area overlying the junction to collect charges.

The present invention increases the source-coupling ratio in integrated circuit memories by shifting at least part of the programming function to gate-to-gate tunneling. Hot electron tunneling occurs from the source line poly, through a thin intermediate oxide, to the floating gate poly for programming under typical programming voltage arrangements. It is understood that the erasing occurs in the reverse situation under typical erasing voltage arrangements.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A flash memory cell system, comprising:
    a first floating gate formed on a floating gate dielectric layer and disposed between a first drain and a source;
    a source gate dielectric layer formed on the first floating gate;
    a first source gate formed on the source gate dielectric layer;
    a first dielectric layer formed on the first source gate;
    a first high temperature oxide layer disposed on the first dielectric layer;
    a source polycrystalline silicon plug disposed on the source and separated from the first floating gate by the first high temperature oxide layer, wherein the source polycrystalline silicon plug is connected to the source and the first source gate to boost electron injections to the first floating gate; and
    a first control gate disposed laterally adjacent the first floating gate and the first source gate with the first high temperature oxide layer disposed vertically therebetween.

2. The system of claim 1, wherein the first dielectric layer comprises a tetraethylorthosilane (TEOS) oxide layer formed on the first source gate.

3. The system of claim 1, wherein the floating gate dielectric layer is an oxide, or an oxide-nitride-oxide film.

4. The system of claim 1, wherein the source gate dielectric layer is an oxide film.

5. The system of claim 1, wherein the first floating gate is formed over a substrate, the source polycrystalline silicon plug is electrically coupled to the source, the source and the first drain are each formed within the substrate and the floating gate dielectric layer is disposed between the first floating gate and a channel formed within the substrate between the first drain and the source.

6. The system of claim 5, wherein an intersection between the channel and the source is disposed beneath a lateral edge of the first floating gate.

7. The system of claim 1, wherein contact portions of the source polycrystalline silicon plug include a silicide formed thereon.

8. The system of claim 1, wherein the first floating gate stores electrical charges injected from the source through the source gate dielectric layer and the floating gate dielectric layer.

9. The system of claim 1, wherein a channel is formed within a substrate and an intersection between the source and the channel is formed beneath an edge of the first floating gate.

10. The system of claim 1, wherein the first control gate controls a charging and discharging of the first floating gate.

11. The system of claim 1, further comprising:
one or more conductive vias coupled to a self-aligned silicide disposed on the first drain for connecting to other electrical circuits; and
one or more sidewall spacers disposed between the one or more conductive vias and the first control gate.

12. A non-volatile memory device, comprising:
a first floating gate formed on a floating gate dielectric layer and disposed between a first drain and a source;
a second floating gate formed on the floating gate dielectric layer and disposed between a second drain and the source;
a source gate dielectric layer formed on the first and second floating gates;
a first source gate and a second source gate formed on the source gate dielectric layer;
a first dielectric layer and a second dielectric layer formed on the first and second source gates, respectively;
a first high temperature oxide and a second high temperature oxide formed on the first and second dielectric layers, respectively;
a source polycrystalline silicon plug formed on the source and separated from the first floating gate and the second floating gate by the first and second high temperature oxide layers, respectively, wherein the source polycrystalline silicon plug is connected to the source, the first source gate, and the second source gate to boost electron injections to the first and second floating gates; and
a first control gate disposed laterally adjacent the first floating gate and the first source gate with the first high temperature oxide layer disposed vertically therebetween;
a second control gate disposed laterally adjacent the second floating gate and the second source gate with the second high temperature oxide layer disposed vertically therebetween.

13. The device of claim 12, wherein the first and second dielectric layers further comprise a tetraethylorthosilane (TEOS) oxide layer formed on the first and second source gates.

14. The device of claim 12, wherein the floating gate dielectric layer is an oxide, or an oxide-nitride-oxide film.

15. The device of claim 12, wherein the source gate dielectric layer is an oxide film.

16. The device of claim 12, wherein the first and second floating gates are formed over a substrate, the source polycrystalline silicon plug is electrically coupled to the source, the source, the first drain, and the second drain are each formed within the substrate and the floating gate dielectric layer is disposed between the first floating gate and a channel formed within the substrate between the first drain and the source.

17. The device of claim 12, wherein contact portions of the source polycrystalline silicon plug include a silicide formed thereon.

18. The device of claim 12, wherein the first and second floating gates store electrical charges injected from the source through the source gate dielectric layer and the floating gate dielectric layer.

19. The device of claim 12, wherein the first and second control gates control a charging and discharging of the first and second floating gates, respectively.

* * * * *